US008253612B2

(12) United States Patent
Lin

(10) Patent No.: US 8,253,612 B2
(45) Date of Patent: Aug. 28, 2012

(54) SELF-CALIBRATING R-2R LADDER AND METHOD THEREOF

(75) Inventor: Chia-Liang Lin, Fremont, CA (US)

(73) Assignee: Realtek Semiconductor Corp., Hsinchu (TW)

( * ) Notice: Subject to any disclaimer, the term of this patent is extended or adjusted under 35 U.S.C. 154(b) by 172 days.

(21) Appl. No.: 12/902,435

(22) Filed: Oct. 12, 2010

(65) Prior Publication Data

US 2011/0089988 A1    Apr. 21, 2011

Related U.S. Application Data

(60) Provisional application No. 61/252,567, filed on Oct. 16, 2009.

(51) Int. Cl.
*H03M 1/10* (2006.01)

(52) U.S. Cl. .......................... 341/121; 341/118; 341/154

(58) Field of Classification Search .................. 341/120, 341/121, 118, 145, 154
See application file for complete search history.

(56) References Cited

U.S. PATENT DOCUMENTS

| | | | |
|---|---|---|---|
| 4,340,882 A * | 7/1982 | Maio et al. ..................... 341/118 |
| 4,441,136 A | 4/1984 | Hampshire | |
| 4,468,607 A * | 8/1984 | Tanaka et al. .................. 323/354 |
| 5,153,592 A * | 10/1992 | Fairchild et al. .............. 341/118 |
| 5,187,482 A | 2/1993 | Tiemann et al. | |
| 5,212,484 A * | 5/1993 | Hillis ........................... 341/154 |
| 5,404,142 A | 4/1995 | Adams et al. | |
| 5,684,482 A | 11/1997 | Galton | |
| 5,969,658 A * | 10/1999 | Naylor .......................... 341/154 |
| 6,304,608 B1 | 10/2001 | Chen et al. | |
| 7,330,141 B2 * | 2/2008 | Temerinac et al. ........... 341/120 |
| 7,400,281 B2 * | 7/2008 | Versari et al. ................. 341/120 |
| 7,468,686 B2 * | 12/2008 | Brubaker ....................... 341/121 |
| 7,714,759 B1 * | 5/2010 | Mu ................................ 341/154 |
| 7,773,019 B2 * | 8/2010 | Soude et al. ................... 341/154 |
| 8,089,380 B2 * | 1/2012 | McLachlan et al. .......... 341/120 |
| 8,120,517 B2 * | 2/2012 | Saito ............................. 341/118 |
| 2009/0073012 A1* | 3/2009 | Lin ............................... 341/120 |

* cited by examiner

*Primary Examiner* — Thomas J Hiltunen
(74) *Attorney, Agent, or Firm* — Thomas, Kayden, Horstemeyer & Risley, LLP

(57) ABSTRACT

A method and apparatus are provided for calibrating a ladder circuit. The apparatus includes: a logic unit for receiving a first logical signal, a second logical signal, and N control bits and for outputting N alternative control bits and an additional control bit, where N is an integer greater than 1; a core circuit for receiving the N alternative control bits, the additional control bit, and a tuning word, and for outputting an output signal, wherein the core circuit comprises N−1 series elements, N shunt elements with a connectivity controlled by the N alternative control bits, respectively, and a termination element with a connectivity controlled by the additional control bit; and a calibration circuit for receiving the first logical signal, the second logical signal, and the output signal and for outputting the tuning word. When the first logical signal is 0, the apparatus operates in a normal mode and the output signal follows the N control bits; when the first logical signal is 1, the apparatus operates in a calibration mode and the output signal follows the second logical signal. When the apparatus operates in the calibration mode, the tuning word is adjusted in a closed loop manner so as to make the output signal substantially the same regardless of a value of the second logical signal.

20 Claims, 4 Drawing Sheets

SELF-CALIBRATING R-2R LADDER AND METHOD THEREOF

CROSS REFERENCE TO RELATED APPLICATIONS

This application claims the benefits of a U.S. Provisional Application No. 61/252,567, filed on Oct. 16, 2009 and entitled "SELF-CALIBRATING R-2R LADDER AND METHOD THEREOF," the contents of which are incorporated herein by reference.

BACKGROUND OF THE INVENTION

1. Field of the Invention

The present invention relates to R-2R circuits, and in particular to method and apparatus of calibrating an R-2R ladder circuit.

2. Description of Related Art

R-2R ladder circuits (hereafter R-2R ladder) are widely used for digital-to-analog converter (DAC). As depicted in FIG. 1, a prior art N-bit R-2R ladder 100 comprises (N−1) series resistors 121-123 of a nominal resistance R, N shunt resistors 111-114 of a nominal resistance 2R (which is twice as large as R) shunt to N control bits D[N−1]-D[0], respectively, and a termination resistor 130 of a nominal resistance 2R terminated to ground. For each control bit, the voltage level is set to a reference voltage $V_{REF}$ when the control bit is 1, and set to zero (i.e. grounded) when the control bit is 0. The output voltage $V_{OUT}$ is:

$$V_{OUT} = (D[N-1] \cdot 2^{N-1} + D[N-2] \cdot 2^{N-2} + \ldots + D[0] \cdot 2^0) \cdot V_{REF}/2^N,$$

or $$V_{OUT} = (D[N-1] \cdot 2^{N-1} + D[N-2] \cdot 2^{N-2} + \ldots + D[0] \cdot 2^0) \cdot V_{LSB},$$

which is linearly proportional to the number represented by the controlling code D[N−1:0], where $V_{LSB} = V_{REF}/2^N$. In practice, a manufacturing process cannot guarantee a perfectly accurate resistance for each resistor. This effectively introduces an error to the output voltage $V_{OUT}$. A particular specification of interest regarding a DAC's accuracy is the DNL (differential non-linearity). Ideally, the DAC's total output voltage will have an incremental change of $V_{LSB}$ in response to an incremental change of the number represented by the control code D[N−1:0]. DNL is defined as the difference between the actual incremental change and the ideal incremental change of the output voltage. The worst case DNL usually occurs when the control code makes an incremental change from where all bits of the control code, except for the MSB (most-significant bit), are 1 to where all bits of the control code, except for the MSB (most-significant bit), are 0.

What is desired is method of calibrating the DAC error.

BRIEF SUMMARY OF THIS INVENTION

In an embodiment, an apparatus comprises: a logic unit for receiving a first logical signal, a second logical signal, and N control bits and for outputting N alternative control bits and an additional control bit, where N is an integer greater than 1; a core circuit for receiving the N alternative control bits, the additional control bit, and a tuning word, and for outputting an output signal, wherein the core circuit comprises N−1 series elements, N shunt elements with a connectivity controlled by the N alternative control bits, respectively, and a termination element with a connectivity controlled by the additional control bit; and a calibration circuit for receiving the first logical signal, the second logical signal, and the output signal and for outputting the tuning word. When the first logical signal is 0, the apparatus operates in a normal mode and the output signal follows the N control bits; when the first logical signal is 1, the apparatus operates in a calibration mode and the output signal follows the second logical signal. When the apparatus operates in the calibration mode, the tuning word is adjusted in a closed loop manner so as to make the output signal substantially the same regardless of a value of the second logical signal.

In another embodiment, a method is used for calibrating a ladder circuit comprising N shunt elements, N−1 series elements, and a termination element, where N is an integer greater than 1. The method comprises the following steps of:
(a) selecting a subject shunt element for calibration;
(b) identifying a subset of the N shunt elements comprising a collection of those among the N shunt elements that are less significant than the subject shunt element;
(c) acquiring a first sample by sampling an output voltage of the ladder circuit while activating the subject shunt element and de-activating the termination element and the rest of the N shunt elements;
(d) acquiring a second sample by sampling the output voltage of the ladder while activating the termination element and each of the subset of the N shunt elements that are less significant than the subject shunt element and de-activating the rest of the N shunt elements;
(e) subtracting the first sampled value by the second sampled value to generate an error term; and
(f) adjusting an impedance of the subject shunt element according to the error term.

In yet another embodiment, the steps of (b) to (f) (above) are repeated a plurality of times. In a yet further embodiment, steps (a) to (f) are repeated, but in step (a), a different subject shunt element is selected.

DETAILED DESCRIPTION OF THIS INVENTION

Figure 1:
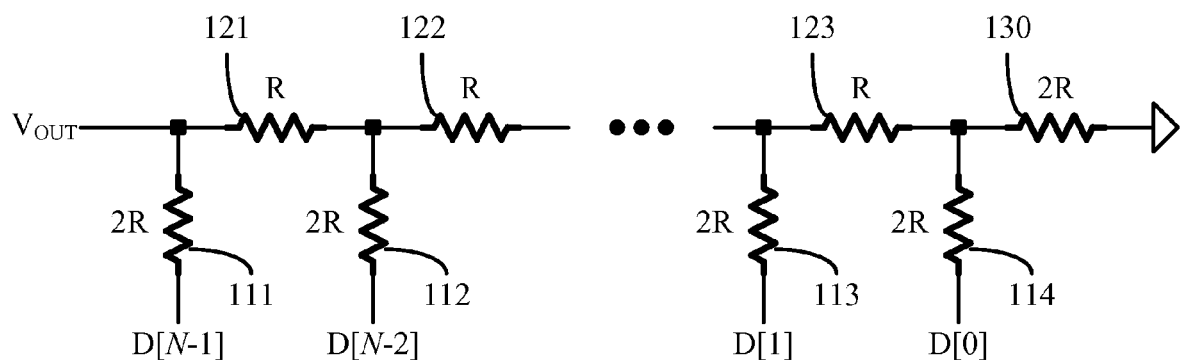
FIG. 1 shows a schematic diagram of a prior art R-2R ladder.

The present invention is directed to embodiments of R-2R ladder circuits, in particular to method and apparatus of calibrating R-2R ladder. While the specification describes several example embodiments of the invention considered best modes of practicing the invention, it should be understood that the invention can be implemented in many ways and is not limited to the particular examples described below or to the particular manner in which any features of such examples are implemented. In other embodiments, well-known details are not shown or described to avoid obscuring aspects of the invention.

Embodiments of the present invention are applicable to a variety of forms of R-2R ladder circuit. By way of example but not limitation, a 4-bit R-2R ladder 200 is depicted in FIG. 2 in accordance with one embodiment of the present invention. As mentioned earlier, the worse case DNL for a 4-bit DAC occurs when the control code increments from code 7 (i.e., D[3:0]=0111, where all control bits are 1 except for the MSB) to code 8 (i.e. D[3:0]=1000, where all bits are 0 except for the MSB). Embodiments of present invention seek to calibrate the shunt resistor corresponding to the MSB so that the incremental change in the output level from code 7 to code 8 is as close to the ideal value (i.e., $V_{LSB}$) as possible. The method for calibration the MSB cell is described as follows. First, apply code 7 and at the same shunt the termination resistor to the logical high voltage (i.e. $V_{REF}$) to generate a first output voltage that has a nominal level of $8 \cdot V_{LSB}$. Sample the resultant output voltage at the load and save it as a first sampled voltage. Next, apply code 8 and at the same time shunt the termination resistor to ground (i.e. logical low voltage) to generate a second output voltage that also has a nominal level of $8 \cdot V_{LSB}$. Sample the resultant output voltage at the load and save it as a second sampled voltage. Deduct the second sampled voltage from the first sampled voltage to obtain an error term. If the error term is positive, indicating the first sampled voltage is greater than the second sampled voltage and thus the resistance of the MSB resistor is too large, slightly decrease the resistance of the MSB resistor. If the error is negative, indicating the first sampled voltage is smaller than the second sampled voltage and thus the resistance of the MSB resistor is too small, slightly increase the resistance of the MSB resistor. The procedure is repeated to gradually reduce the difference between the two sampled voltages. In this manner, the resistance of the MSB resistor is calibrated to make the output level of code 8 close to the output level of code 7 plus $V_{LSB}$.

Figure 2A:
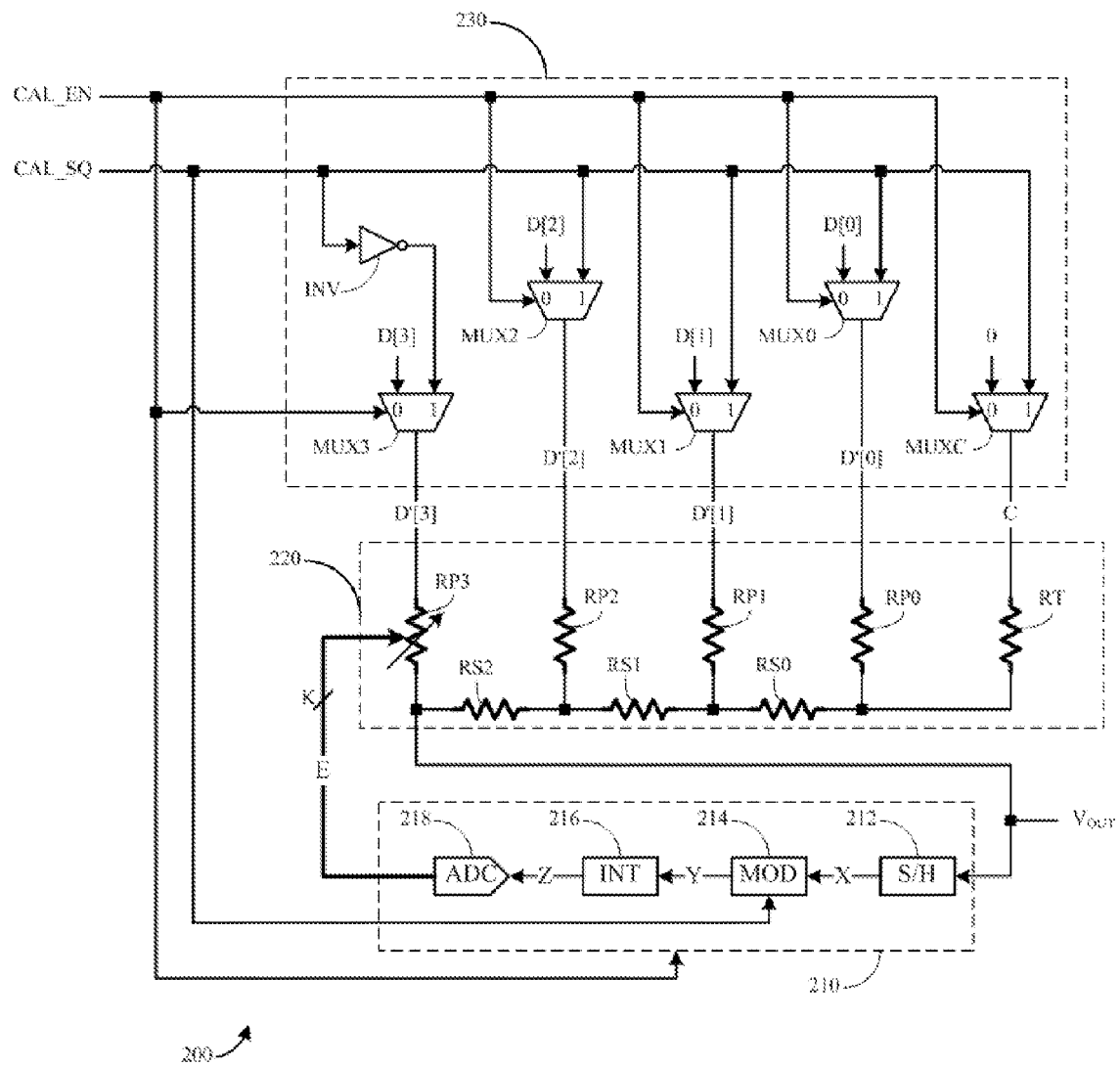
FIG. 2A shows a self-calibrating R-2R ladder circuit.
Figure 2B:
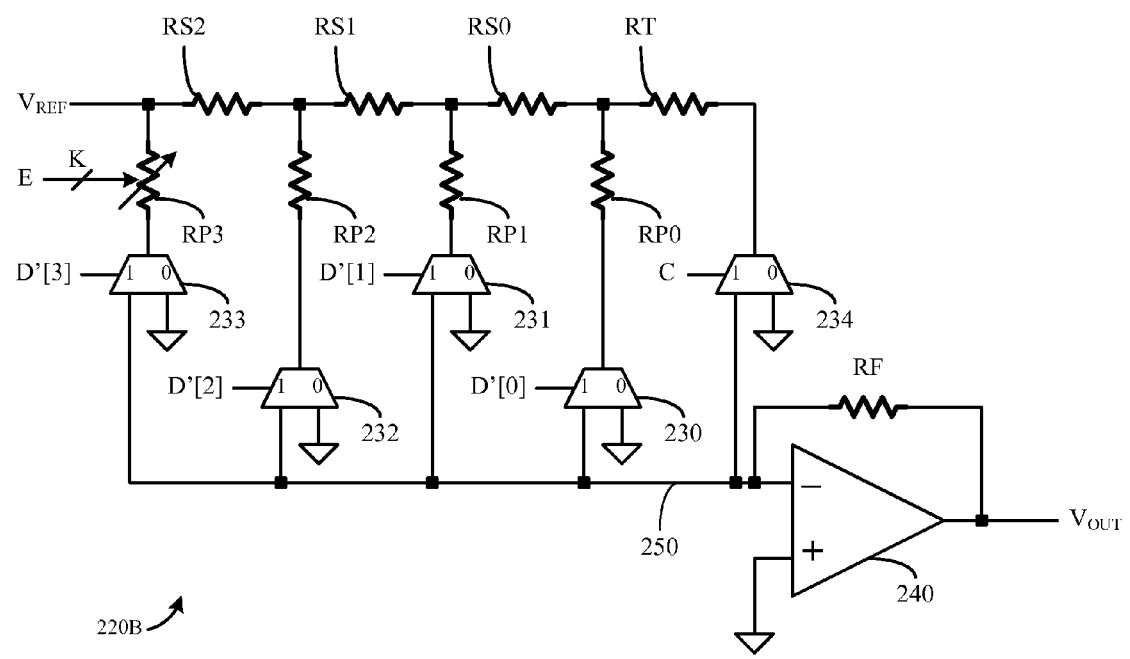
FIG. 2B shows an alternative R-2R ladder circuit.

An embodiment in accordance with the present invention is shown in FIG. 2A. DAC 200 includes a core circuit 220, a calibration circuit 210, and a logical circuit 230. The logical circuit 230 receives control bits D[3:0] and two logical signals, CAL_EN and CAL_SQ, and outputs alternative control bits D'[3:0] and a additional control bit C. The core circuit 220 is similar (in certain aspects) to a prior art R-2R ladder circuit and comprises: a plurality of series resistors (i.e., RS2, RS1, and RS0), each of a nominal resistance of R; a plurality of shunt (or parallel) resistors (i.e., RP3, RP2, RP1, and RP0), each of a nominal resistance of 2R (i.e. twice as large as R); and a termination resistor RT of a nominal resistance of 2R. The shunt resistors RP3-RP0 are coupled to D'[3:0] and the termination resistor RT is coupled to C.

Unlike the prior art R-2R ladder 100 of FIG. 1, the MSB shunt resistor RP3 is tunable and controlled by a K-bit code word E. When CAL_EN is 0, DAC 200 works in a normal node and behaves similarly to the prior art R-2R ladder 100 of FIG. 1. In this case, D'[3:0]=D[3:0] and C=0; the shunt resistors RP0-RP3 are effectively shunt to D[0], D[1], D[2], and D[3], respectively; and the termination resistor RT is terminated to ground (i.e. the voltage level of logical 0). When CAL_EN is 1, DAC 200 works in a calibration mode, wherein: when CAL_SQ is 1, all shunt resistors, except for RP3 (i.e., the MSB shunt resistor), and the termination resistor RT is terminated to $V_{REF}$ (i.e. voltage level of logical 1), while RP3 is shunt to ground (i.e. voltage level of logical 0); when SQ is 0, all shunt resistors, except for RP3 (i.e., the MSB shunt resistor), and the termination resistor RT are shunt to ground, while RP3 is shunt to $V_{REF}$. Calibration circuit 210 is activated when CAL_EN is 1. When activated, calibrating circuit 210 receives the output voltage $V_{OUT}$ and adaptively updates the K-bit control word E. When not activated, the K-bit control word E is frozen. The principle of the calibration is explained as follows.

Instead of directly shunting the four shunt resistors RP0-RP3 to the control bits D[0], D[1], D[2], and D[3], respectively, one uses multiplexers MUX0, MUX1, MUX2, and MUX3 to generate alternative control bits D'[0], D'[1], D'[2], and D'[3], respectively, to shunt the four shunt resistors. When CAL_EN is 0, D'[3:0]=D[3:0] C=0, and DAC 200 works in a normal mode. When CAL_EN is 1, D'[3:0]=0111 (i.e. code 7) if CAL_SQ is 1, and D'[3:0]=1000 (i.e. code 8) if CAL_SQ is 0. The termination resistor RT is terminated to the additional control bit C, which is generated from multiplexer MUXC so that: C=0 when CAL_EN=0, and C=CAL_SQ otherwise. Therefore, the termination resistor RT is terminated to $V_{REF}$ (i.e. the voltage level of logical 1) only during the calibration mode and only when code 7 is applied, and terminated to ground (i.e. the voltage level of logical 0) otherwise.

In a preferred embodiment, CAL_SQ is a sequence alternating between 1 and 0 when the calibration is enabled (i.e. CAL_EN=1). Therefore, DAC 200 is alternating between code 7 (when CAL_SQ=1) and code 8 (when CAL_SQ=0) under the calibration mode (when CAL_EN=1). During code 7, the termination resistor RT is terminated to $V_{REF}$, resulting in a first level in the output voltage $V_{OUT}$ that is nominally $8 \cdot V_{LSB}$ (=$V_{REF}$). During code 8, only the MSB shunt resistor RP3 is shunt to $V_{REF}$, resulting in a second level in the output voltage VOUT that is also nominally $8 \cdot V_{LSB}$ (=$V_{REF}$). Due to finite manufacturing precision, however, the first level will be different from the second level. Calibration circuit 210 includes a sample-and-hold circuit (S/H) 212, a modulator (MOD) 214, an integrator (INT) 216, and an analog-to-digital converter (ADC) 218. The output voltage VOUT is sampled and held by S/H 212, therefore the output X of S/H 212 alternates between the first level (when CAL_SQ=1) and the second level (when CAL_SQ=0). MOD 214 receives output X from S/H 212 and generates an output Y by multiplying X by either 1 (when CAL_SQ=1) or −1 (when CAL_SQ=0). Integrator 216 generates an output Z by performing a cumulative sum on the output Y from MOD 214.

As a result, the output Z from integrator 216 is effectively a cumulative sum of the difference between the first level and the second level. Output Z from integrator 216 is converted into the K-bit control word E by ADC 218 to control the level of the tunable cell i3. If the first level is greater than the second level, the K-bit control word E will move up to increase the level of the tunable cell i3. If first level is smaller than the second level, the K-bit control word E will move down to decrease the level of the tunable cell i3. In this manner, the level of the tunable cell i3 is adjusted in a feedback loop to make the first level approach the second level, thus minimizing the DNL between code 7 and code 8.

Certain principles of the present invention can be practiced in various alternative embodiments. It is not limited to R-2R ladder circuits. For instance, it can also be implemented in a switch-capacitor 2C-C ladder circuit. Further, it is not limited to the particular circuit topology shown in FIG. 2A. For instance, it also applies to the R-2R circuit 220B shown in FIG. 2B, which is an alternative R-2R topology readily known to those of ordinary skill in the art and thus not described in detail here (here, the shunt resistors RP0-RP3 are either terminated to ground or to a virtual ground node 250 via multiplexers 230-233, depending on the respective logical values of the alternative control bits D'[3:0], and the termination resistor RT is either terminated to ground or to the virtual ground node 250 via multiplexer 234, depending on the logical value of the additional control bit C; operational amplifier 240 and feedback resistor RF are used to form a virtual ground condition for node 250). It is not limited to a 4-bit DAC. It applies to any DAC that includes a more significant cell and a plurality of less significant cells, where the nominal weight of the more significant cell is greater than a sum of the nominal weights of the less significant cells by a unit amount.

The present invention can then be used to calibrate the more significant cell so as to reduce the difference between the weight of the more significant cell and the sum of the weights of the less significant cells plus the unit amount. This present invention can also be practiced in a recursive manner. For instance, for a 5-bit DAC having 5 shunt resistors RP0-RP4 carrying nominal weights $2^0 \cdot V_{LSB}$, $2^1 \cdot V_{LSB}$, $2^2 \cdot V_{LSB}$, $2^3 \cdot V_{LSB}$, and $2^4 \cdot V_{LSB}$, respectively, one may first calibrate the RP3 shunt resistor so as to minimize the DNL between code 7 and code 8. With the RP3 shunt resistor being calibrated, one may then calibrate the RP4 shunt resistor so as to minimize the DNL between code 15 (where all shunt resistors except RP4 are shunt to $V_{REF}$) and code 16 (where all shunt resistors except RP4 are shunt to ground). In this manner, one calibrates a less significant cell first, and step by step moves on to calibrate a more significant cell.

Figure 3:
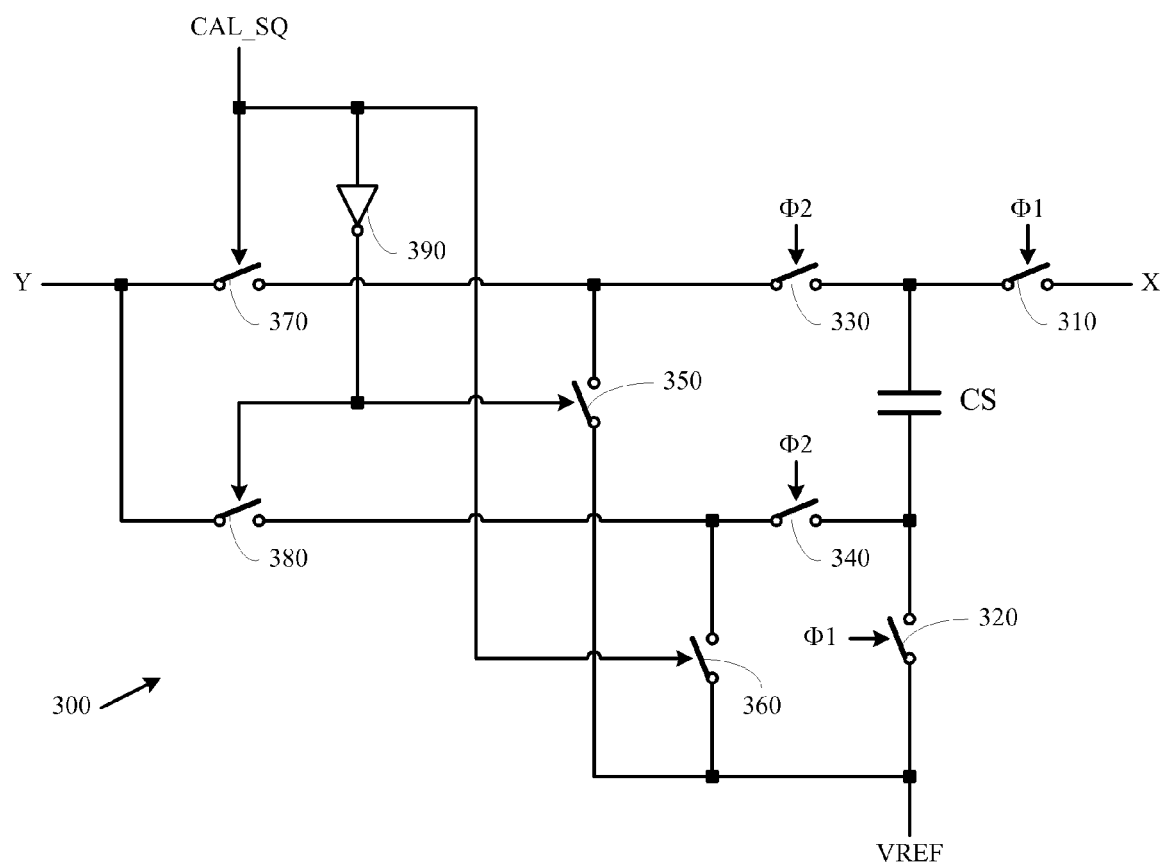
FIG. 3 shows a modulator circuit.

Embodiments of sample-and-hold circuit, multiplexer, and discrete-time integrator are all well known in prior art and thus not described in detail here. FIG. 3 depicts an embodiment 300 for embodying modulator 214 of FIG. 2. Embodiment 300 includes: a sampling capacitor CS, a plurality of switches (310, 320, 330, and 340) operating in accordance with a two-phase non-overlapping clock Φ1 and Φ2, and a plurality of switches (350, 360, 370, and 380) operating in accordance with CAL_SQ and its logical inversion (generated by using inverter 390). During a sampling phase (where Φ=1 and Φ2=0), the voltage at X is sampled by the sampling capacitor CS. During a transfer phase (where Φ1=0 and Φ2=1), the sampled voltage is transferred to output Y without a polarity inversion if CAL_SQ=1, and transferred to output Y with a polarity inversion if CAL_SQ=0. Here, VREF denotes a fixed-potential node.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An apparatus comprising:
    a logic unit for receiving a first logical signal, a second logical signal, and N control bits and for outputting N alternative control bits and an additional control bit, where N is an integer greater than 1;
    a core circuit for receiving the N alternative control bits, the additional control bit, and a tuning word, and for outputting an output signal, wherein the core circuit comprises N-1 series elements, N shunt elements with a connectivity controlled by the N alternative control bits, respectively, and a termination element with a connectivity controlled by the additional control bit; and
    a calibration circuit for receiving the first logical signal, the second logical signal, and the output signal and for outputting the tuning word.

2. The apparatus of claim 1, wherein: each of the N-1 series elements is nominally of a nominal impedance, each of the N shunt elements is nominally of twice of the nominal impedance, and the termination element is also nominally of twice of the nominal impedance.

3. The apparatus of claim 1, wherein: the N shunt elements includes a most significant shunt element with a connectivity controlled by a most significant alternative control bit and N-1 less significant shunt elements with a connectivity controlled by N-1 less significant alternative control bits, respectively, and the most significant shunt element is tunable and tuned by the tuning word.

4. The apparatus of claim 3, wherein: the N alternative control bits are of the same logical values as those of the N control bits, respectively, and the additional control bit is 0 when the first logical signal is 0.

5. The apparatus of claim 4, wherein: the most significant alternative control bit is a logical inversion of the second logical signal and the N-1 less significant alternative control bits and the additional control bit are all of the same logical value as that of the second logical signal when the first logical signal is 1.

6. The apparatus of claim 5, wherein the second logical signal is an alternating sequence.

7. The apparatus of claim 1, wherein the output signal is nominally of the same value when the first logical signal is 1 regardless of a value of the second logical signal.

8. The apparatus of claim 7, wherein the tuning word is adjusted by the calibration circuit so that the output signal is substantially of the same value when the first logical signal is 1 regardless of the value of the second logical signal.

9. The apparatus of claim 8, wherein the calibration circuit comprises a sampling circuit for sampling the output signal to generate a sampled signal, a modulation circuit for modulating the sampled signal using the second logical signal to generate an error signal, an integrator for integrating the error signal to generate an tuning signal, and an analog-to-digital converter for converting the tuning signal into the tuning word.

10. The apparatus of claim 9, wherein: the calibration circuit is activated only when the first logical signal is 1, and the tuning word is frozen when the first logical signal is 0.

11. A method of calibrating a ladder circuit comprising N shunt elements, N-1 series elements, and a termination element, where N is an integer greater than 1, the method comprising the following steps of:
    (a) selecting a subject shunt element for calibration;
    (b) identifying a subset of the N shunt elements comprising a collection of those among the N shunt elements that are less significant than the subject shunt element;
    (c) acquiring a first sample by sampling an output voltage of the ladder circuit while activating the subject shunt element and de-activating the termination element and a remainder of the N shunt elements;
    (d) acquiring a second sample by sampling the output voltage of the ladder circuit while activating the termination element and each of the subset of the N shunt elements that are less significant than the subject shunt element and de-activating the remainder of the N shunt elements;
    (e) subtracting the first sampled value by the second sampled value to generate an error term; and
    (f) adjusting an impedance of the subject shunt element according to the error term.

12. The method of claim 11 further comprising repeating steps (b) to (f) for plurality of times.

13. The method of claim 11 further comprising repeating steps (a) to (f) but selecting a different subject shunt element in step (a).

14. The method of claim 13, wherein the different subject shunt element is more significant than the previously selected subject shunt element.

15. The method of claim 11, wherein the subject shunt element is adjusted so as to minimize a value of the error term.

16. The method of claim 11, wherein each of the N-1 series elements is nominally of a nominal impedance, each of the N shunt elements is nominally of twice of the nominal impedance, and the termination element is also nominally of twice of the nominal impedance.

17. The method of claim 11, wherein: a shunt element is activated when a terminal of the shunt element is coupled to a first voltage, and de-activated when the terminal of the shunt element is coupled to a second voltage; and the termination element is activated when a terminal of the termination element is coupled to the first voltage, and de-activated when the terminal of the termination element is coupled to the second voltage.

18. The method of claim 11, wherein: a shunt element is activated when a terminal of the shunt element is coupled to a circuit node of a virtual ground, and de-activated when the terminal of the shunt element is coupled to ground; and the termination element is activated when a terminal of the termination element is coupled to the circuit node of virtual ground, and de-activated when the terminal of the termination element is coupled to ground.

19. The method of claim 18, wherein an operational amplifier is used to fulfill a condition for the virtual ground.

20. An apparatus comprising:
a logic unit to receive a first logical signal, a second logical signal, and a plurality of first control signals and for outputting a plurality of second control signals;
a core circuit for receiving the plurality of second control signals and a tuning word, and for outputting an output signal, wherein the core circuit comprises: a plurality of series elements, a plurality of shunt elements and a termination element, wherein the shunt elements and the termination element have a connectivity controlled by the plurality of second control signals, respectively; and
a calibration circuit for receiving the first logical signal, the second logical signal, and the output signal and for outputting the tuning word.

\* \* \* \* \*